United States Patent [19]

Moore et al.

[11] Patent Number: 5,484,922
[45] Date of Patent: Jan. 16, 1996

[54] INTERNAL JUNCTION ORGANIC ELECTROLUMINHESCENT DEVICE WITH A NOVEL COMPOSITION

[75] Inventors: Christopher P. Moore, Harrow, England; Steven A. VanSlyke; Henry J. Gysling, both of Rochester, N.Y.

[73] Assignee: Eastman Kodak Company, Rochester, N.Y.

[21] Appl. No.: 195,805

[22] Filed: Feb. 14, 1994

Related U.S. Application Data

[63] Continuation-in-part of Ser. No. 912,376, Jul. 13, 1992, abandoned.

[51] Int. Cl.$^6$ .................. C07D 215/30; H05B 33/26; B32B 15/04
[52] U.S. Cl. .................. 546/7; 313/503; 313/504
[58] Field of Search ........................ 546/7

[56] References Cited

U.S. PATENT DOCUMENTS

| | | | |
|---|---|---|---|
| 3,180,730 | 4/1965 | Klupfel et al. | 96/1 |
| 3,567,450 | 3/1971 | Brantly et al. | 96/1.5 |
| 3,658,520 | 4/1972 | Brantly et al. | 260/576 |
| 3,935,031 | 1/1976 | Adler | 136/206 |
| 4,175,960 | 11/1979 | Berwick et al. | 430/58 |
| 4,356,429 | 10/1982 | Tang | 313/503 |
| 4,539,507 | 9/1985 | VanSlyke et al. | 313/504 |
| 4,720,432 | 1/1988 | VanSlyke et al. | 313/504 |
| 4,769,292 | 9/1988 | Tang et al. | 313/504 |
| 4,885,211 | 12/1989 | Tang et al. | 428/457 |
| 4,950,950 | 8/1990 | Perry et al. | 313/504 |
| 5,047,687 | 9/1991 | VanSlyke | 313/503 |
| 5,141,671 | 8/1992 | Bryan | 546/7 |
| 5,150,006 | 9/1992 | VanSlyke | 546/7 |

OTHER PUBLICATIONS

Chapman, Ed, Correlation Analysis in Chemistry (Plenum Press), 1987, pp. 453–467, 464, 472, 480–481.
Scherrer, Anal. Chem 40, 1938 (1985).
Morozova, Chem Abs 108, 37891 (1985).
Horihata, Bull Chem Soc Japan 61, 2499 (1988).
Sonsale, Ind. J. Chem 14A, 408 (1976).
Unny, Inc. J. Chem 19A, 484 (1980).

*Primary Examiner*—Mark L. Berch
*Attorney, Agent, or Firm*—Raymond L. Owens

[57] ABSTRACT

The invention comprises a novel composition containing, and an organic electroluminescent device employing, an aluminum chelate of the formula:

$$[(Q)_{3-n}Al]_xL_n$$

wherein n is 1 and x is 1 or 2, or n is 2 and x is 1; and,

Q is a substituted 8-quinolinolato group in which the 2-position substituent is selected from the group consisting of hydrocarbon groups containing from 1 to 10 carbon atoms, amino, aryloxy and alkoxy groups;

L is a ligand, each L ligand being individually selected from (a) the group consisting of —R, —Ar, —OR, —ORAr, —OAr, —OC(O)R, —OC(O)Ar, —OP(O)R$_2$, —OP(O)Ar$_2$, —OS(O$_2$)R, —OS(O$_2$)Ar, —SAr, —SeAr, —TeAr, —OSiR$_3$, —OSiAr$_3$, —OB(OR)$_2$, —OB(OAr)$_2$, and —X, when x is 1, or from (b) —OC(O)Ar'C(O)O— or —OAr'O—, when x is 2, where R is a hydrocarbon group containing from 1 to 6 carbon atoms, Ar and Ar' are, respectively, monovalent and divalent aromatic groups containing up to 36 carbon atoms each, and X is a halogen; with the proviso that when L is a phenolic group n is 2 and x is 1.

1 Claim, 1 Drawing Sheet

INTERNAL JUNCTION ORGANIC ELECTROLUMINHESCENT DEVICE WITH A NOVEL COMPOSITION

FIELD OF THE INVENTION

This application is a continuation-in-part of Ser. No. 07/912,376 filed Jul. 13, 1992 abandoned.

The invention relates to a novel aluminum chelate composition. The novel composition is additionally utilized in internal junction organic electroluminescent devices.

BACKGROUND OF THE INVENTION

Materials that can be stimulated to emit light, commonly referred to as luminescent materials or luminophors, can be employed in a wide variety of applications. In a simple application a luminophor can be employed to absorb ultraviolet radiation and emit visible light. In other applications one of a variety of different stimulating sources of radiation, such as electrons, $\alpha$ or $\beta$ particles, $\gamma$ rays or X rays, can be employed. In still another type of application, referred to as electroluminescence, the recombination of hole-electron pairs can provide the stimulating energy source for luminescence.

For many luminophor applications there is a need for thin (<1 $\mu$m) film luminophors. Specific examples of luminophors used to construct thin films are provided by VanSlyke et al U.S. Pat. No. 4,539,507, Tang et al U.S. Pat. No. 4,769,292, VanSlyke et al U.S. Pat. No. 4,720,432, Tang et al U.S. Pat. No. 4,885,211, Perry et al U.S. Pat. No. 4,950,950, VanSlyke U.S. Pat. No. 5,150,006 (22 Sep. 92), Van Slyke U.S. Pat. No. 5,151,629, and Bryan et al U.S. Pat. No. 5,141,671 (25 Aug. 92).

In U.S. Pat. No. 5,150,006, Van Slyke et al. U.S. Pat. Nos. 5,151,629, and 5,141,671, two 2-methyl-8-hydroxyquinoline (2MQ) ligands were complexed to aluminum. In U.S. Pat. No. 5,151,629, highly efficient electroluminescent devices were described comprising an oxygen bridged complex with structure $(2MQ)_2AlOAl(2MQ)_2$ as the emitting component. U.S. Pat. No. 5,141,671, teaches a structure $(2MQ)_2AlOAr$ where Ar represents a phenyl or substituted phenyl moiety that has a lower efficiency but higher stability. The tris complex $Al(2MQ)_3$ could not be formed by the method described in U.S. Pat. No. 5,141,671, because three 2MQ ligands could not coordinate effectively to a single aluminum.

In P. R. Scherer, Q. Fernando, "Reaction of 2-Methyl-8-Quinolinol with Aluminum (III) in Nonaqueous Media," Anal. Chem. 40(13), 1938(1968), the authors describe the preparation of a 1:1 adduct of $Al(2MQ)_3$ and DMSO. The tris complex $Al(2MQ)_3$ was not isolated, and the structure of the adduct was not determined conclusively. Fluorescence by the adduct sufficient for electroluminescent applications was not reported.

Until the discovery of the $(2MQ)_2AlOAr$ compounds, no isolatable fluorescent metal chelates of Al with 2-methyl-8-hydroxyquinoline other than $(2MQ)_2AlOAl(2MQ)_2$ were known. Unfortunately, the synthetic methodology used to prepare $(2MQ)_2AlOAr$ is limited, precluding the synthesis of aluminum chelates of 2-methyl-8-hydroxyquinoline with a third ligand other than a phenol which was contemplated to be useful as an emitting compound in electroluminescent devices. Attempts to prepare, for example, a compound by reacting benzoic acid rather than phenol with aluminum isopropoxide and 2-methyl-8-hydroxyquinoline resulted, by the methods of preparation described in the above patents, in the formation of the $(2MQ)_2AlOAl(2MQ)_2$ compound.

One application in which the novel composition of this invention can be used is electroluminescent devices. Electroluminescent devices (hereinafter also referred to as EL devices) contain spaced electrodes separated by an electroluminescent medium that emits light in response to the application of an electrical potential difference across the electrodes.

In currently preferred forms organic EL devices are comprised of an anode, an organic hole injecting and transporting zone in contact with the anode, an electron injecting and transporting zone forming a junction with the organic hole injecting and transporting zone, and a cathode in contact with the electron injecting and transporting zone. When an electrical potential is placed across the electrodes, holes and electrons are injected into the organic zones from the anode and cathode, respectively. Light emission results from hole-electron recombination within the device.

SUMMARY OF THE INVENTION

The invention comprises a novel composition containing, and an electroluminescent device which uses, an aluminum chelate of the formula:

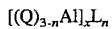

$[(Q)_{3-n}Al]_xL_n$ wherein n is 1 and x is 1 or 2, or n is 2 and x is 1; and,

Q is a substituted 8-quinolinolato group in which the substituents are individually selected (a) from the group consisting of hydrogen, hydrocarbon groups containing from 1 to 10 carbon atoms, amino, cyano, halogen, and $\alpha$-haloalkyl substituents, or (b) from the group consisting of —OR', —SO$_2$—R', —C(O)R', —C(O)NR'R" and —C(O)OR', wherein R' and R" are the same or different substituent, and each is hydrogen, an aryl or aliphatic substituent having from 1 to 7 carbon atoms, a hydroxy group, an alkoxy or an aryloxy group;

L is a ligand, each L ligand being individually selected either (a) from the group consisting of —R, —Ar, —OR, —ORAr, —OAr, —OC(O)R, —OC(O)Ar, —OP(O)R$_2$, —OP(O)Ar$_2$, —OS(O$_2$)R, —OS(O$_2$)Ar, —SAr, —SeAr, —TeAr, —OSiR$_3$, —OSiAr$_3$, —OB(OR)$_2$, —OB(OAr)$_2$, and —X, when x is 1, or (b) from —OC(O)Ar'C(O)O— or —OAr'O—, when x is 2, where R is a hydrocarbon group containing from 1 to 6 carbon atoms, Ar and Ar' are, respectively, monovalent and divalent aromatic groups containing up to 36 carbon atoms each, and X is a halogen; with the proviso that when L is a phenolic group n is 2 and x is 1.

One of the applications of the novel compounds is directed to improving the internal junction organic electroluminescent (EL) device. The EL devices comprise of, in sequence, an anode, an organic hole injecting and transporting zone, an organic electron injecting and transporting zone, and a cathode.

The organic electron injecting and transporting zone of the EL device is comprised of an electron injecting layer in contact with the cathode and an electron transporting layer which is interposed between the electron injecting layer and the organic hole injecting and transporting zone. The electron transporting layer comprises the novel composition.

DESCRIPTION OF THE PREFERRED EMBODIMENTS

Figure 1:
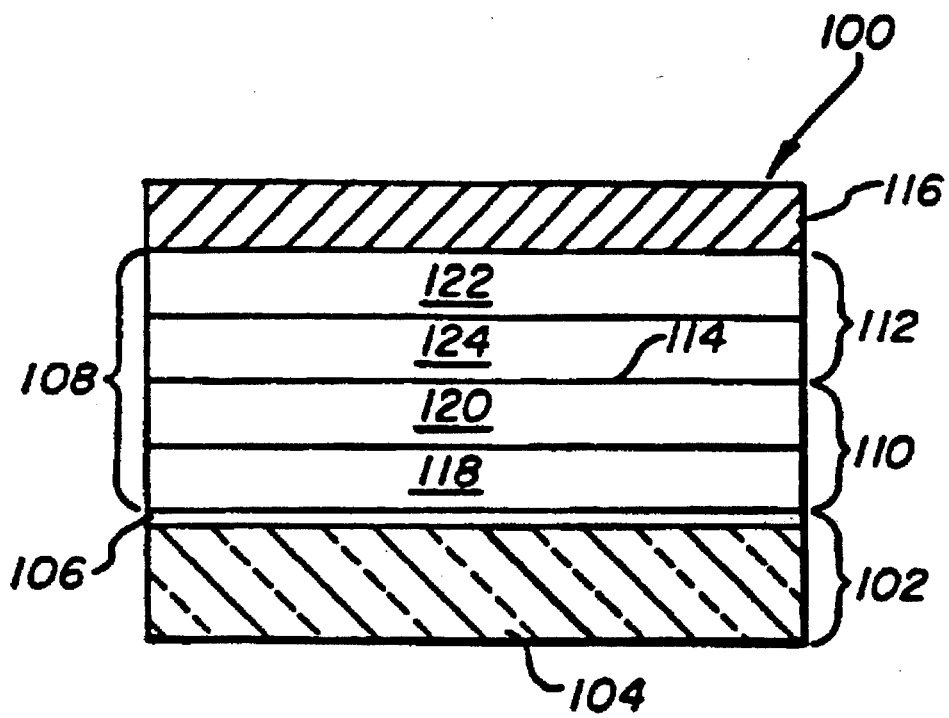
FIG. 1 is a schematic diagram of an organic EL device satisfying the preferred requirements of the invention.

The novel luminescent composition is comprised of a mixed ligand aluminum chelate. The chelate serves as a charge accepting compound, where $R^s$ is a ring substituent of the 8-quinolinolato ring nucleus chosen to block or limit the attachment of more than two 8-quinolinolato ligands to the aluminum atom or any other equivalent atom such as boron, gallium or indium. These compounds can be represented by the basic formula:

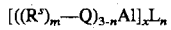
$$[((R^s)_m\text{—}Q)_{3-n}Al]_xL_n$$

wherein when n is 1, x is either 1 or 2;

or when n is 2, x is 1;

m ranges from 1 to 6;

L is generally any ligand where the donor atom is selected from the periodic groups 4a–7a; with the proviso that n is 2 and x is 1 when the ligand (L) is a phenolic moiety;

Q in each occurrence represents a substituted 8-quinolinolato ligand; and $R^s$ represents an 8-quinolinolato ring substituent which blocks or impairs the facile attachment of more than two substituted 8-quinolinolato ligands to the aluminum atom.

The invention specifically comprises a composition containing an aluminum chelate of the formula (I):

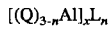
$$[(Q)_{3-n}Al]_xL_n$$

wherein n is 1 and x is 1 or 2, or n is 2 and x is 1; and,

Q is a substituted 8-quinolinolato group in which the substituents are selected either (a) from the group consisting of hydrogen, hydrocarbon substituents containing from 1 to 10 carbon atoms, amino, cyano, halogen, and α-haloalkyl substituents, or (b) from the group consisting of —OR', —SO$_2$—R', —C(O)R', —C(O)NR'R" and —C(O)OR', wherein R' and R" are the same or different substituents, and each is hydrogen, an aryl or aliphatic group having from 1 to 7 carbon atoms, a hydroxy group, or an alkoxy or aryloxy group;

L is a ligand, each L ligand being individually selected from (a) the group consisting of —R, —Ar, —OR, —ORAr, —OAr, —OC(O)R, —OC(O)Ar, —OP(O)R$_2$, —OP(O)Ar$_2$, —OS(O$_2$)R, —OS(O$_2$)Ar, —SAr, —SeAr, —TeAr, —OSiR$_3$, —OSiAr$_3$, —OB(OR)$_2$, —OB(OAr)$_2$, and —X, when x is 1, or from (b) —OC(O)Ar'C(O)O— or —OAr'O—, when x is 2, where R is a hydrocarbon group containing from 1 to 6 carbon atoms, Ar and Ar' are, respectively, monovalent and divalent aromatic groups containing up to 36 carbon atoms each, and X is a halogen; with the proviso that when L is a phenolic group n is 2 and x is 1.

The advantage of employing an aluminum chelate with one or two substituted 8-quinolinolato ligand(s) and one or two ligand(s) which are not substituted 8-quinolinolato ligands is that all of the potential physical properties of tris(8-quinolinolato)aluminum(III) chelates are attained. More specifically, the preferred aluminum chelates of the present invention that can be deposited from the vapor phase to form the electron transporting layer of the organic EL device. Vapor phase deposition is the preferred approach to construction of the organic layer sequence of organic EL devices. Vapor phase deposition allows extremely thin layers of well controlled thickness and uniformity to be deposited. No solvents or other extraneous materials need be brought into contact with the deposition substrate, the hole injecting and transporting zone, that would dissolve, contaminate or degrade the performance of this substrate zone. Vapor phase deposition has the further advantage of allowing the rate of deposition to be controlled and of allowing greater freedom and flexibility in device construction. Testing the novel compositions in the organic EL devices has established acceptable stability (retention of at least a half of initial luminescent intensity for more than 25 hours).

In its basic form the ligand, L, is selected from the periodic groups 4a–7a. Specifically, L is a ligand selected from the group consisting of —R, —Ar, —OR, —ORAr, —OAr, —OC(O)R, —OC(O)Ar, —OP(O)R$_2$, —OP(O)Ar$_2$, —OS(O$_2$)R, —OS(O$_2$)Ar, —SAr, —SeAr, —TeAr, —OSiR$_3$, —OSiAr$_3$, —OB(OR)$_2$, —OB(OAr)$_2$, —X, —OC(O)Ar'C(O)O—, and —OAr'O—, where R is an hydrocarbon group containing from 1 to 6 carbon atoms, Ar and Ar' are, respectively, monovalent and divalent aromatic groups containing up to 36 carbon atoms, and X is a halogen; except when L is a phenolic group x is 1 and n is 2.

It has been determined that the preferred L ligands are derived from LH non-phenolic moieties when n and x are one, where LH is selected from the group consisting of benzoic acid and its derivatives and triphenylsilanol and its derivatives, with the group having 3–24 carbon atoms. Derivatives include fused ring derivatives such as naphthalene, anthracene, pyrene, napthacene and perylene.

"Phenolic group", as used herein, means an L group represented by —OAr where Ar is a substituted or non-substituted phenyl ring.

Aromatic groups Ar (monovalent) and Ar' (divalent) include radicals derived from aromatic compounds such as monocyclic compounds whose rings consist only of carbon atoms, such as benzene and toluene, and also heterocyclic compounds such as pyridine and thiophene. Aromatic groups Ar and Ar' include polycyclic compounds whose ring atoms are all carbon, such as naphthalene and anthracene, and also polycyclic compounds containing heterocyclic rings. Examples 35 and 36 illustrate aromatic groups Ar derived from 4-phenylphenol and phenol, respectively. Examples 37 and 38 illustrate aromatic groups Ar' derived from 4,4'-biphenol and terephthalic acid, respectively. Examples 11 and 13 illustrate the use of non-phenolic groups derived from 3-hydroxy-2-naphthoic acid and 2-picolinic acid.

Also when n is two, LH includes hydroxybenzene or a variety of hydrocarbon substituted hydroxybenzenes, hydroxynaphthalenes and other fused ring hydroxyhydrocarbons. Monomethyl substitution of the ligand moiety has been determined to shorten emission wavelengths. To achieve that effect, it is preferred that the ligand contain at least 7 carbon atoms. Generally there is little advantage to be gained by employing ligand(s) with very large numbers of carbon atoms. However, investigations of ligands with 18 aromatic ring carbon atoms have revealed high levels of stability. Thus, the ligands preferably contain from 7 to 18 total carbon atoms.

Aliphatic substituents of the phenolic L ligand can contain from 1 to 12 carbon atoms each. Alkyl substituents of the phenolic L ligand range preferably from 1 to 3 carbon atoms. Methyl substituents, in particular, are preferred.

Aromatic hydrocarbon substituents of the phenolic group are preferably phenyl or naphthyl rings. Phenyl, diphenyl and triphenyl substitution of the benzoic acid and silanol moiety have all been observed to produce highly desirable organic EL device characteristics.

Ligands derived from α or β naphthols have been observed to produce aluminum chelates of exceptional levels of stability. A limited degree of emission shifting to shorter wavelengths is also realized, similar to that exhibited by hydroxybenzene derived phenolic L ligands. Use of an aluminum chelate with an L ligand derived from naphthoic acid, in combination with blue emitting fluorescent dyes, as described below, can result in highly desirable electroluminescent devices.

From comparisons of ortho, meta and para substituted homologues of the various phenolic L ligands it has been determined that little, if any, difference in performance is attributable to the position of the hydrocarbon substituent on the phenyl ring.

In a preferred form the ligands of the aluminum chelates satisfy the following formulas:

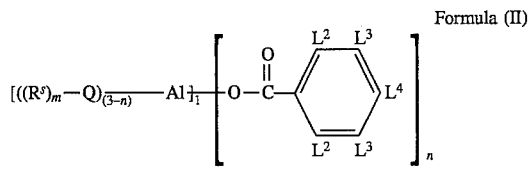

Formula (II)

or

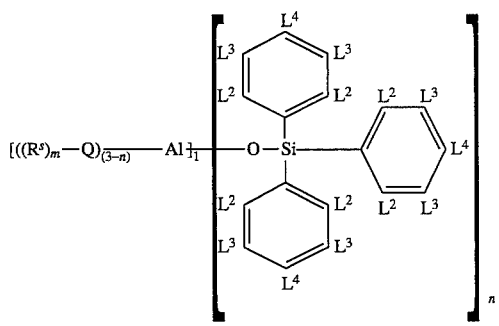

wherein $R^s$, Q and n are as defined above and $L^2$, $L^3$ and $L^4$ collectively contain 18 or fewer carbon atoms and each independently represent hydrogen, cyano, amino, hydrocarbon groups of from 1 to 12 carbon atoms or other conventional substituents, with the proviso that $L^2$ and $L^3$ or $L^3$ and $L^4$ together can form a fused ring.

Preferred aluminum chelates also satisfy the formula (III):

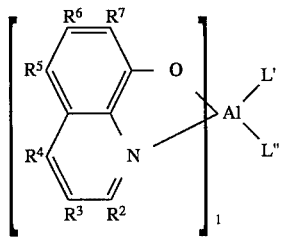

wherein $R^2$ to $R^7$ are substituents of an 8-quinolinolato ligand, said substituents being individually selected for each 8-quinolinolato ligand either (a) from the group consisting of hydrogen, hydrocarbon groups containing from 1 to 10 carbon atoms, amino, cyano, halogen, and α-haloalkyl, or (b) from the group consisting of —OR', —SO₂—R', —C(O)R', —C(O)NR'R" and —C(O)OR', wherein R' and R" are the same or different groups, and each is hydrogen, an aryl or aliphatic group having from 1 to 7 carbon atoms, a hydroxy group, or an ethoxy or methoxy group, and wherein $R^2$ and $R^3$ or $R^3$ and $R^4$ are substituted to form a fused ring; and, L' and L" represent the same or different ligands, and each satisfies the following formula:

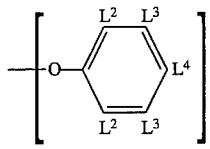

wherein $L^2$ to $L^4$ are substituents which collectively contain up to 18 carbon atoms and individually are selected from the group consisting of hydrogen, hydrocarbon groups containing from 1 to 12 carbon atoms, cyano, amino, and halogen substituents.

With regard to formulas (II) and (III), $L^2$ and $L^3$ or $L^3$ and $L^4$ can be substituted to form a fused ring, polycyclic group having 10 to 20 carbon atoms. Thus, in formula (III), $L^3$ and $L^4$ can each be substituted with two carbon atoms to form a naphthyl polycyclic group having 10 carbon atoms.

Although either or both of the 8-quinolinolato rings can contain substituents other than a steric blocking substituent, or a substituent which impairs the addition of more than two 8-quinolinolato rings to the chelate, further substitution of the rings is not required. It is appreciated further that more than one substituent per ring is possible. The various steric blocking substituent possibilities are most easily visualized by reference to the following formula:

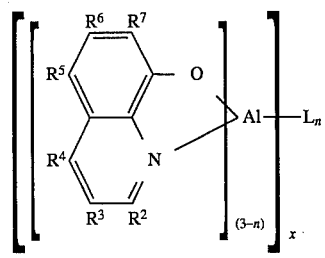

where L can take any form described above and $R^2$ to $R^7$ represent substituents at each of ring positions 2 to 7. Substituents at the 4, 5 and 6 ring positions are not favorably located to hinder sterically or otherwise impair the bonding of three 8-quinolinolato nuclei to a single aluminum atom, while it is contemplated that large substituents at the 3 or 7 ring positions could provide sufficient steric hindrance. On the other hand, the 2 ring position is suited to provide hindrance (e.g., steric hindrance), and even a very small substituent (e.g., a methyl group) in this ring positions can provide an effective blocking substituent. For synthetic convenience it is specifically preferred that steric blocking substituents be located in the 2 ring positions. As employed herein the term "steric blocking" is employed to indicate that the $(R^s)_m$—Q ligand will normally not coordinate effectively for inclusion as the third ligand of the aluminum atom.

It has been observed that substituents on the 8-quinolinolato rings can also perform useful hue shifting functions. The quinoline ring consists of fused benzo and pyridino rings. When the pyridino ring component of the quinoline ring is substituted with one or more electron donating substituents the effect is to shift the hue of emission to a lower wavelength. "Electron donating" or "accepting", as used herein, can be determined by the Hammett values which are listed in the tables below. Electron donating substituents at the ortho and para positions of the pyridino ring (that is, the 2 and 4 positions of the quinoline ring) particularly influence the hue of emission, while the meta position on the pyridino ring (the 3 position on the quinoline ring) has a comparatively small influence on the hue of emission. Although steric hindrance is entirely independent of electron donating or accepting properties and, thus, $R^2$ can take the form of either an electron donating or accepting group, it is preferred to choose $R^2$ from among electron donating groups. By adding a second electron donating group $R^4$ a further blue shift in peak emission wavelength is achieved. $R^3$, when present, can take any synthetically convenient form, but is preferably also electron donating.

By contrast:, electron accepting substituents on the benzo ring component of the quinoline nucleus shift the hue of emission to shorter wavelengths. Thus, any or all of substituents at the 5, 6 and 7 quinoline ring positions, when present, are preferably electron accepting.

It is well within the skill of the art to determine whether a particular substituent is electron donating or electron accepting. The electron donating or accepting properties of several hundred of the most common substituents, reflecting all common classes of substituents have been determined, quantified and published. The most common quantification of electron donating and accepting properties is in terms of Hammett σ values. Substituents with negative Hammett σ values are electron donating while those with positive Hammett σ values are electron accepting. Hydrogen has a Hammett σ value of zero, while other substituents have Hammett σ values that increase positively or negatively in direct relation to their electron accepting or donating characteristics. Lange's Handbook of Chemistry, 12th Ed., McGraw Hill, 1979, Table 3–12, pp. 3–134 to 3–138, here incorporated by reference, lists Hammett σ values for a large number of commonly encountered substituents. Hammett σ values are assigned based on phenyl ring substitution, but they provide a workable guide for qualitatively selecting electron donating and accepting substituents for the quinoline ring. The Hammett σ values of several substituents are reproduced below.

| Hammett Constants | | |
|---|---|---|
| Substituent | σ meta | σ para |
| —AsO$_3$H— | −0.09 | −0.02 |
| —B(OH)2 | 0.01 | 0.45 |
| —Br | 0.39 | 0.27 |
| —CH$_2$Br | | |
| -p-C$_6$H$_4$Br | | 0.08 |
| -m-C$_6$H$_4$Br | | 0.09 |
| —CH$_3$ | −0.07 | −0.17 |
| —C$_2$H$_5$ | −0.07 | −0.15 |
| -n-C$_3$H$_7$ | −0.05 | −0.13 |
| -i-C$_3$H$_7$ | −0.07 | −0.15 |
| -n-C$_4$H$_9$ | −0.07 | −0.16 |
| -sec-C$_4$H$_9$ | | −0.12 |
| -i-C$_4$H$_9$ | −0.07 | −0.12 |
| -t-C$_4$H$_9$ | −0.10 | −0.20 |
| —CH$_2$—C(CH$_3$)$_3$ | | −0.23 |
| —C(CH$_3$)$_2$(C$_2$H$_5$) | | −0.19 |
| -n-C$_5$H$_{11}$ | | |
| -n-C$_7$H$_{15}$ | | |
| -cyclohexyl | | |
| —CH$_2$-cyclohexyl | | |
| -3,4-[CH$_2$]$_3$-(fused ring) | | −0.26 |
| -3,4-[CH$_2$]$_4$-(fused ring) | | −0.48 |
| -3,4-[CH]$_4$-(fused ring) | 0.06 | 0.04 |
| —CH=CH$_2$ | 0.02 | |

-continued

| Hammett Constants | | |
|---|---|---|
| Substituent | σ meta | σ para |
| —CH=C(CH$_3$)$_2$ | | |
| —CH=CH—CH$_3$ (trans) | | |
| —CH=CH—C$_6$H$_5$ | | |
| —CH$_2$—CH=CH$_2$ | | |
| —CH$_2$—CH=CH—CH$_3$ | | |
| —CH=CH—C$_6$H$_5$ | 0.14 | −0.05 |
| —C≡CH | 0.21 | 0.23 |
| —CH$_2$—C≡CH | | |
| —C≡C—C$_6$H$_5$ | 0.14 | 0.16 |
| —C$_6$H$_5$ | 0.06 | 0.01 |
| -p-C$_6$H$_4$CH$_3$ | | −0.05 |
| -1-naphthyl (also-2-) | | |
| —CH$_2$—C$_6$H$_5$ | | −0.05 |
| —CH$_2$—CH$_2$—CH$_5$ | | |
| —CH(CH$_3$) —C$_6$H$_5$ | | |
| -2-furoyl | | |
| -3-indolyl | | |
| -2-thienyl | | |
| -2-thienylmethyl | | |
| —CH(C$_6$H$_5$)$_2$ | | |
| —CH$_2$-(1-naphthyl) | | |
| —CHO | 0.36 | 0.22 |
| —CO—CH$_3$ | 0.38 | 0.50 |
| —CO—C$_6$H$_5$ | 0.34 | 0.46 |
| —CO—CF$_3$ | | 0.65 |
| —CO—NH$_2$ | 0.28 | 0.36 |
| —CO—NH—C$_6$H$_5$ | | |
| —COOH | 0.37 | 0.41 |
| —CO—OCH$_3$ | 0.32 | 0.39 |
| —CO—OC$_2$H$_5$ | 0.37 | 0.45 |
| —CH$_2$—CO—NH$_2$ | | |
| —CH$_2$—CO—NH—C$_6$H$_5$ | | |
| —CH$_2$CO—OCH$_3$ | | |
| —CH$_2$—CO—OC$_2$H$_5$ | | |
| —CH$_2$COO$^-$ | | |
| —CH$_2$—CH$_2$—CO—NH$_2$ | | |
| —CH$_2$—CH$_2$—COOH | −0.03 | −0.07 |
| —CH$_2$—CH$_2$—CH$_2$—CO—NH$_2$ | | |
| —Cl | 0.35 | 0.30 |
| —CCl$_3$ | 0.47 | |
| —CH$_2$Cl | 0.12 | 0.18 |
| —CHCl$_2$ | | |
| —CH$_2$—CCl$_3$ | | |
| —CH$_2$—CH$_2$—CCl$_3$ | | |
| —CH=CCl$_2$ | | |
| —CH$_2$—CH=CCl$_2$ | | |
| -p-C$_6$H$_4$Cl | | 0.08 |
| —F | 0.34 | 0.06 |
| —CF$_3$ | 0.47 | 0.54 |
| —CH$_2$—CF$_3$ | | |
| —CH$_2$F | | |
| —CHF$_2$ | | |
| —CH$_2$—C$_3$F$_7$ | | |
| —Ge(CH$_3$)$_3$ | | 0.00 |
| —Ge(C$_2$H$_5$)$_3$ | | 0.00 |
| —H | | |
| —I | 0.35 | 0.30 |
| —CH$_2$I | | |
| —IO$_2$ | 0.70 | 0.76 |
| —N$_2^+$ | 1.76 | 1.91 |
| —N$_3$ | 0.33 | 0.08 |
| —NH$_2$ | −0.04 | −0.66 |
| —NH$_3^+$ | 1.13 | 1.70 |
| —CH$_2$—NH$_2$ | | |
| —CH$_2$—NH$_3^+$ | | |
| —CH$_2$—N(CH$_3$)$_3^+$ | | |
| —NH—NH$_2$ | −0.02 | −0.55 |
| —CN | 0.61 | 0.66 |
| —CH$_2$—CN | 0.17 | 0.01 |
| —NH—CH$_3$ | −0.30 | −0.84 |
| —NH—C$_2$H$_5$ | −0.24 | −0.61 |
| —NH-n-C$_4$H$_9$ | −0.34 | −0.51 |
| —NH(CH$_3$)$_2^+$ | | |
| —N(CH$_3$)$_2$ | −0.15 | −0.83 |

Hammett Constants

| Substituent | σ meta | σ para |
|---|---|---|
| $-N(CH_3)_3^+$ | 0.88 | 0.82 |
| $-NH_2-CH_3^+$ | 0.96 | |
| $-NH_2-C_2H_5^+$ | | 0.96 |
| $-N=N-C_6H_5$ | 0.64 | |
| $-N(CF_3)_2$ | 0.45 | 0.53 |
| $-p-C_6H_4NH_2$ | | −0.30 |
| $-NO$ | | 0.12 |
| $-NO_2$ | 0.71 | 0.78 |
| $-CH_2-CH_2-NO_2$ | | |
| $-p-C_6H_4NO_2$ | | 0.23 |
| $-m-C_6H_4NO_2$ | | 0.18 |
| $-NH-OH$ | −0.04 | −0.34 |
| $-NH-CO-CH_3$ | 0.21 | 0.00 |
| $-NH-CO-C_2H_5$ | | |
| $-NH-CO-C_6H_5$ | 0.22 | 0.08 |
| $-NH-CHO$ | | 0.25 |
| $-NH-CO-NH_5$ | | 0.18 |
| $-CH_2-CO-NH_2$ | | |
| $-CH_2-NH-CO-CH_3$ | | |
| $-NH-CO-OC_2H_5$ | 0.33 | |
| $-NH-CH_2-CO-OC_2H_5$ | −0.10 | −0.68 |
| $-NH-SO_2-C_6H_5$ | | |
| $-N(COCH_3)(COC_6H_5)$ | | |
| $-N(COCH_3)(1\text{-naphthyl})$ | | |
| $-N(COCH_3)(2\text{-naphthyl})$ | | |
| $-O^-$ | −0.71 | −0.52 |
| $-OH$ | 0.10 | −0.37 |
| $-OCH_3$ | 0.14 | −0.32 |
| $-OC_2H_5$ | 0.07 | −0.24 |
| $-O\text{-}n\text{-}C_3H_5$ | 0.00 | −0.25 |
| $-O\text{-}i\text{-}C_3H_5$ | 0.05 | −0.45 |
| $-O\text{-}n\text{-}C_4H_9$ | −0.05 | −0.32 |
| $-O\text{-cyclohexyl}$ | 0.29 | |
| $-O\text{-cyclopentyl}$ | | |
| $-O-CH_2\text{-cyclohexyl}$ | 0.18 | |
| $-O-C_6H_5$ | 0.25 | −0.32 |
| $-O-CH_2-OC_6H_5$ | | −0.42 |
| $-3,4\text{-}O-CH_2-O-$ | | −0.27 |
| $-3,4\text{-}O-[CH_2]_2-O-$ | | −0.12 |
| $-OCF_3$ | 0.36 | 0.32 |
| $-ONO_2$ | | |
| $-O-CO-CH_3$ | 0.39 | 0.31 |
| $-O-N=C(CH_3)_2$ | | |
| $-ONH_3^+$ | | |
| $-CH_2-OH$ | 0.08 | 0.08 |
| $-CH_2-OCH_3$ | | |
| $-CH(OH)-CH_3$ | | |
| $-CH(OH)-C_6H_5$ | | |
| $-p\text{-}CrH_4OH$ | | −0.24 |
| $-p\text{-}C_6H_4OCH_3$ | | −0.09 |
| $-CH_2-CH(OH)-CH_3$ | | |
| $-CH_2-C(OH)(CH_3)_2$ | | |
| $-P(CH_3)_2$ | 0.1 | 0.05 |
| $-P(CH_3)_3^+$ | 0.8 | 0.9 |
| $-P(CF_3)_2$ | 0.6 | 0.7 |
| $-PO_3H^-$ | 0.2 | 0.26 |
| $-PO(OC_2H_5)_2$ | 0.55 | 0.60 |
| $-SH$ | 0.25 | 0.15 |
| $-SCH_3$ | 0.15 | 0.00 |
| $-S(CH_3)_2^+$ | 1.00 | 0.90 |
| $-SC_2H_5$ | 0.23 | 0.03 |
| $-S\text{-}n\text{-}C_3H_7$ | | |
| $-S\text{-}n\text{-}C_4H_9$ | | |
| $-S\text{-cyclohexyl}$ | | |
| $-SC_6H_5$ | 0.30 | |
| $-S-C(C_6H_5)_3$ | | |
| $-S-CH_2-C_6H_5$ | | |
| $-S-CH_2-CH_2-C_6H_5$ | | |
| $-CH_2-SH$ | 0.03 | |
| $-CH_2-S-CH_2-C_6H_5$ | | |
| $-S-CF_3$ | 0.35 | 0.38 |
| $-SCN$ | 0.63 | 0.52 |
| $-S-CO-CH_3$ | 0.39 | 0.44 |
| $-S-CO-NH_2$ | 0.34 | |
| $-SO-CH_3$ | 0.52 | 0.49 |
| $-SO-C_6H_5$ | | |
| $-SO_2-CH_3$ | 0.68 | 0.72 |
| $-SO_2-C_6H_5$ | | |
| $-SO_2\text{-}n\text{-}C_3H_7$ | | |
| $-SO_2-C_6H_5$ | 0.67 | |
| $-SO_2-CF_3$ | 0.79 | 0.93 |
| $-SO_2-NH_2$ | 0.46 | 0.57 |
| $-CH_2-SO_2-CH_3$ | | |
| $-SO_3^-$ | 0.05 | 0.09 |
| $-SO_3H$ | | 0.50 |
| $-SeCH_3$ | 0.1 | 0.0 |
| $-Se\text{-cyclohexyl}$ | | |
| $-SeCN$ | 0.67 | 0.66 |
| $-Si(CH_3)_3$ | −0.04 | −0.07 |
| $-Si(C_2H_5)_3$ | 0.0 | |
| $-Si(CH_3)_2(C_6H_5)$ | | |
| $-Si(CH_3)_2-O-Si(CH_3)_3$ | | |
| $-CH_2-Si(CH_3)_3$ | −0.16 | −0.21 |
| $-CH_2-CH_2-Si(CH_3)_3$ | | |
| $-Sn(CH_3)_3$ | | 0.0 |
| $-Sn(C_2H_5)_3$ | | 0.0 |

The following constitute specific examples of preferred mixed ligand aluminum chelates satisfying the requirements of the invention:

TABLE II

Examples $((R^s)_m\text{-}Q)_2AlL$

| Example | LH *$(R^s)_m\text{-}Q$ is 2-Methyl-8-hydroxyquinoline* |
|---|---|
| 1 | benzoic acid |
| 2 | 4-methylbenzoic acid |
| 3 | 4-methoxybenzoic acid |
| 4 | 2-phenylbenzoic acid |
| 5 | 4-phenylbenzoic acid |
| 6 | 4-dimethylaminobenzoic acid |
| 7 | 4-diphenylaminobenzoic acid |
| 8 | 4-cyanobenzoic acid |
| 9 | 4-trifluoromethylbenzoic acid |
| 10 | 2-naphthoic acid |
| 11 | 3-hydroxy-2-naphthoic acid |
| 12 | 9-anthroic acid |
| 13 | 2-picolinic acid |
| 14 | acetic acid |
| 15 | trifluoroacetic acid |
| 16 | benzenesulphonic acid |
| 17 | trifluoromethanesulphonic acid |
| 18 | diphenylphosphonic acid |
| 19 | triphenylsilanol |
| 20 | tris(4,4'-biphenyl)silanol |
| 21 | t-butanol |
| 22 | benzyl alcohol |
| 23 | 2-pyridylcarbinol |
| 24 | pentafluorophenol |
| 25 | 2-(2-hydroxyphenyl)benzoxazole |
| 26 | 2-(2-hydroxyphenyl)benzothiazole |
| 27 | benzenethiol |

TABLE III

Examples $((R^s)_m\text{-}Q)_2AlL$

| Example | L *$((R^s)_m\text{-}Q)$ is 2-Methyl-8-hydroxyquinoline* |
|---|---|
| 28 | i-butyl |
| 29 | phenyl |
| 30 | chloro |
| 31 | phenylselenyl |
| 32 | phenyltellurenyl |

TABLE III-continued

Examples $((R^s)_m-Q)_2AlL$

| Example | L *$((R^s)_m-Q)$ is 2-Methyl-8-hydroxyquinoline* |
|---|---|
| 33 | trimethyleneborato |

TABLE IV

Examples $((R^s)_m-Q)_2AlL$

| Example | LH *$((R^s)_m-Q)$ is 2-Methyl-8-hydroxyquinoline* |
|---|---|
| 34 | benzoic acid |
| 35 | 4-phenylphenol |
| 36 | phenol |
| | See also the L ligands described in examples 24–26. |

TABLE V

Examples $((R^s)_m-Q)_2AlLZl$ $((R^s)_m-Q)_2$

| Example | L *$((R^s)_m-Q)$ is 2-Methyl-8-hydroxyquinoline* |
|---|---|
| 37 | 4,4'-biphenol |
| 38 | terephthalic acid |
| 39 | phenylboronic acid |

For compounds of formula I where n is 1, a solution of recrystallized substituted 8-quinolinol in anhydrous toluene was added to a solution of tri-i-butylaluminum under argon. Vigorous gas evolution was observed, and after ten minutes the ligand was either added directly or dissolved in anhydrous toluene and added to the mixture under argon. For compounds where n is 2, an appropriate stoichiometry of substituted 8-quinolinol and ligand was used. The reaction mixture was heated to a gentle reflux for 3–6 hours, during which time a cream or yellow precipitate was formed. The product was collected by filtration after cooling the mixture to 0° C. A further sample was obtained on concentrating the filtrate to 25–50% volume, cooling to 0° C., and collecting the precipitate formed. The product was obtained as a cream or yellow powder and could be further purified using vacuum sublimation or recrystallization from toluene.

Although the luminescent composition can consist of any one or combination of the mixed ligand aluminum(III) chelates described above, it is specifically contemplated to employ in combination with the mixed ligand aluminum(III) chelates one or a combination of fluorescent dyes following the teachings of Tang et al U.S. Pat. No. 4,769,292 and VanSlyke U.S. Pat. No. 5,150,006, the disclosures of which are herein incorporated by reference.

The anode and cathode of the internal junction organic EL device can each take any convenient conventional form, such as any of the various forms disclosed by Tang et al U.S. Pat. No. 4,885,211, the disclosure of which is herein incorporated by reference. Aluminum and magnesium cathodes are the subject of VanSlyke et al U.S. Pat. No. 5,059,862. Another contemplated cathode construction is disclosed by Scozzafava et al U.S. Pat. No. 5,073,446, wherein the cathode is constructed of fused metal particles containing at least 80 percent indium and a lower work function metal, such as magnesium. In the preferred form the metal particles have a mean diameter of less than 1 mm and a coefficient of variation of less than 20 percent.

Since cathodes must contain at least one lower (less than 4.0 eV) work function metal to be efficient, cathodes benefit from constructions that protect the lower work function metal from oxidation. It is specifically contemplated to construct the cathode as taught by Littman et al U.S. Pat. No. 5,059,861. In this arrangement the portion of the cathode contacting the organic medium contains at least one metal having work function of <4.0 eV. The cathode additionally includes a capping layer containing at least one alkaline earth or rare earth metal. The metal in the cathode having a work function of <4.0 eV is selected to have a higher work function than the alkaline earth or rare earth metal in the capping layer.

It is additionally contemplated to construct the cathode as taught by VanSlyke U.S. Pat. No. 5,047,687. In this construction the cathode contains at least one metal having a work function of <4.0 eV (other than an alkali metal), and a protective layer overlies the cathode comprised of a metal having a work function in the range from 4.0 to 4.5 eV and at least one organic component of the organic electroluminescent medium, preferably a stilbene or chelated oxinoid compound.

A conventional organic EL device comprising components 102–116, is shown in FIG. 1. Basically, an anode 102 of the device is constructed of a transparent support 104 and a thin transparent conductive layer 106. Overlying, and in contact with, the anode is an organic medium 108 formed by a hole injecting and transporting zone 110 in contact with the anode and an electron injecting and transporting zone 112 forming a junction 114 with the zone 110. The electron injecting and transporting zone is in contact with a cathode 116.

In operation, when the cathode 116 is electrically biased to a negative potential with respect to the anode 102 holes are injected into the organic hole injecting and transporting zone 110 at its interface with the anode and transported across this zone to the junction 114. Concurrently electrons are injected into the electron injecting and transporting zone 112 at its interface with the cathode 116, and the injected electrons are transported toward the junction 114. Recombination of the holes and electrons occurs within the electron injecting and transporting zone adjacent to the junction 114 resulting in electroluminescence within the electron injecting and transporting zone. The hue of the luminescence is determined by the composition of the electron injecting and transporting zone. The light emitted can leave the organic EL device in any direction—i.e., through the edges of the organic medium, the cathode and/or the anode. In the construction shown, which is most common, principal emission occurs through the transparent anode.

While the electron injecting and transporting zone 112 of the conventional organic EL device can take any of the varied forms disclosed in the cited prior art, best performance is realized when the zone 112 employs metal oxinoid charge accepting compounds which are incorporated by reference in VanSlyke et al U.S. Pat. No. 5,150,006.

In the preferred construction encompassing components 102–124 of FIG. 1, the hole injecting and transporting zone consists of a hole injecting layer 118 in contact with the anode and a contiguous hole transporting layer 120 interposed between the hole injecting layer and the electron injecting and transporting zone. Single and two layer hole injecting and transporting zones are illustrated by the prior art cited above and herein incorporated by reference. A particularly preferred hole transporting layer 120 contains a hole transporting aromatic tertiary amine comprised of at least two tertiary amine moieties and includes attached to a tertiary amine nitrogen atom an aromatic moiety containing at least two fused aromatic rings.

The electron injecting and transporting zone 112 comprises an electron injecting layer 122, which is in contact with the cathode, and a contiguous electron transporting layer 124 that is interposed between layer 122 and the hole injecting and transporting zone 110. The electron transporting layer forms a junction 114 with the hole injecting and transporting zone 110.

The electron injecting layer can be formed by any of the materials conventionally employed to form the electron injecting and transporting zone 112. For example, the electron injecting layer can be formed of any of the materials used to form the electron injecting and transporting zones of the organic EL devices disclosed in any of the cited prior art, the disclosures of which are herein incorporated by reference.

Since it is the potential gradient maintained across the organic medium 108 that is responsible for electroluminescence, constructing the organic EL device with the thinnest possible organic medium allows electroluminescence to be achieved with a minimum potential difference between the anode and cathode of the device. Therefore, the smallest practical thickness of the organic medium is preferred. Typically, the thickness of the organic medium is less than 1 μm, preferably less than 5000 Å. The minimum thickness of the organic medium 108 is determined by the minimum thicknesses of the component zones and layers. To avoid quenching of luminescence the cathode 116 should be separated from the junction 114 by a distance of at least 300 Å—(i.e., the electron injecting and transporting zone 112 preferably has a thickness of at least 300 Å.) The only remaining constraints on construction dimensions are the minimum layer thicknesses required to assure continuous layers. Each of the layers 118, 120, 122 and 124 has a minimum thickness of at least 20 Å and preferably at least 50 Å. Although the hole injecting and transporting zone 110 can therefore be quite thin, it is preferred that this zone also have a thickness of at least 300 Å.

Still other thin film forming electron injecting and transporting zone compounds which can be used to form the layer adjacent to the cathode are optical brighteners, particularly those disclosed and incorporated by reference in: VanSlyke et al U.S. Pat. No. 4,539,507 and Vol. 5 of *Chemistry of Synthetic Dyes,* 1971, pages 618–637 and 640. Those that are not thin-film-forming can be rendered so by attaching an aliphatic moiety to one or both end rings.

In a preferred form of the invention a porphyrinic compound forms the hole injecting layer 118 of the organic EL device. A porphyrinic compound is any compound, natural or synthetic, which is derived from or includes the porphyrin structure. Any of the porphyrinic compounds disclosed by Adler U.S. Pat. No. 3,935,031 or Tang U.S. Pat. No. 4,356,429, the disclosures of which are herein incorporated by reference, can be employed.

The hole transporting layer 120 of the organic EL device preferably contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinylene radicals and/or containing at least one active hydrogen containing group are disclosed by Brantley et al U.S. Pat. Nos. 3,567,450 and 3,658,520.

A preferred class of aromatic tertiary amines are those which include at least two aromatic tertiary amine moieties. This class is described and incorporated by reference by Berwick et al U.S. Pat. No. 4,175,960 and VanSlyke et al U.S. Pat. No. 4,539,507.

COMPOUND PREPARATIONS

The following is a description of the preparation and characterization of compounds 1 to 39 listed in Tables II–V. The following examples are presented for a further understanding of the invention.

COMPOUND AND EXAMPLE 1

A solution of recrystallized 8-hydroxy-2-methylquinoline (10 mmol, 1.59 g) in anhydrous toluene (10 ml) was added to a solution of tri-i-butylaluminum (5 mmol, 5 ml 1.0M solution in anhydrous toluene) under argon. Vigorous gas evolution was observed, and after 10 min, a solution of benzoic acid (5 mmol, 611 mg) in anhydrous toluene (10 ml) was added to the mixture under argon. The reaction mixture was heated to a gentle reflux for 3 h, during which time a yellow precipitate was formed. The product was collected by filtration after cooling the mixture to 0° C. A further sample was obtained on concentrating the filtrate to 50% volume, cooling to 0° C., and collecting the precipitate formed. The product was obtained as a yellow powder (2.28 g) which represented a 98% yield.

COMPOUND AND EXAMPLE 5

A solution of recrystallized 8-hydroxy-2-methylquinoline (10 mmol, 1.59 g) in anhydrous toluene (10 ml) was added to a solution of tri-i-butylaluminum (5 mmol, 5 ml 1.0M solution in anhydrous toluene) under argon. Vigorous gas evolution was observed, and after 10 min. anhydrous 4-phenylbenzoic acid (5 mmol, 911 mg) was added directly to the mixture under argon. The reaction mixture was heated to a gentle reflux for 3 h, during which time a yellow precipitate was formed. The product was collected by filtration after cooling the mixture to 0° C. A further sample was obtained on concentrating the filtrate to 50% volume, cooling to 0° C., and collecting the precipitate formed. The product was obtained as a yellow powder (2.70 g) which represented a 99% yield.

COMPOUNDS AND EXAMPLES 2–4, 7, 14–15, 17, 19–27

These compounds were prepared using an analogous procedure to that used for compound 1, except that the appropriate ligand (LH) was employed, as delineated in Table II.

COMPOUNDS AND EXAMPLES 6, 8–13, 16, 18

These compounds were prepared using an analogous procedure to that used for compound 5, except that the appropriate ligand (LH) was employed, as delineated in Table II.

COMPOUND AND EXAMPLE 28

A solution of recrystallized 8-hydroxy-2-methylquinoline (10 mmol, 1.59 g) in anhydrous toluene (10 ml) was added to a solution of tri-i-butylaluminum (5 mmol, 5 ml 1.0M solution in anhydrous toluene) under argon. Vigorous gas evolution was observed and the reaction mixture was heated to a gentle reflux for 3 h, during which time a beige precipitate was formed. The product was collected by filtration, under argon, after cooling the mixture to 0° C. A further sample was obtained by concentrating the filtrate to 50% volume, cooling to 0° C., and collecting the precipitate formed. It was sublimed at 175° C./0.001 torr for 39 h giving the product as a beige, slightly air-sensitive powder (1.42 g) which represented a 77% yield.

COMPOUND AND EXAMPLE 29

A solution of recrystallized 8-hydroxy-2-methylquinoline (41.1 mmol, 6.54 g) in anhydrous toluene (175 ml) was added to triphenylaluminum (20.56 mmol, 5.31 g) under argon. Vigorous gas evolution was observed and the reaction mixture was heated to reflux for 12 h, during which time a yellow precipitate was formed. The reaction mixture was filtered hot through a medium porosity frit under argon, and the filtrate was cooled to −20° C. The resultant precipitate was collected by filtration to give the product as slightly air-sensitive, yellow microcrystals (4.6 g) which represented a 53% yield.

COMPOUND AND EXAMPLE 30

A solution of recrystallized 8-hydroxy-2-methylquinoline (10 mmol, 1.59 g) in anhydrous toluene (10 ml) was added to a solution of diethylaluminum chloride (5 mmol, 5 ml 1.0M solution in anhydrous hexane) under argon, at −78° C. Vigorous gas evolution was observed and the reaction mixture was allowed to warm to 22° C., and was then heated to reflux for 10 h, during which time a yellow precipitate was formed. The product was collected by filtration, under argon, after cooling the mixture to 0° C. It was sublimed at 185° C./0.001 torr for 24 h, and subsequently at 210° C./0.001 torr for 24 h, giving the product as a yellow slightly air-sensitive powder (150 mg) which represented an 8% yield (non-optimised).

COMPOUND AND EXAMPLE 31

Phenylselenol (6.37 mmol, 1.0 g) was added to a solution of compound 28 (6.37 mmol, 2.55 g) in anhydrous toluene (75 ml) under argon. The mixture was heated to reflux for 80 h, and then concentrated to 50% volume. The mixture was heated to reflux to dissolve all the precipitated solid, cooled to −20° C., and the resultant precipitate was collected by filtration. The product was obtained as air-sensitive yellow microcrystals (1.70 g) which represented a 54% yield.

COMPOUND AND EXAMPLE 32

A solution of lithium phenyltelluride (5 mmol) in THF, generated in situ from diphenylditelluride (2.5 mmol, 1.02 g) and lithium triethylborohydride (5 ml of a 1.0M solution in THF), was added to a solution of compound 30 (5 mmol, 1.89 g) in anhydrous toluene (100 ml) under argon. The reaction was stirred at 22° C. for 16 h, filtered, and the filtrate concentrated to 50% volume and cooled to −20° C. The product was obtained as pale yellow air-sensitive crystals (1.4 g) by collecting the precipitate formed, which represented a 51% yield.

COMPOUND AND EXAMPLE 33

A solution of recrystallized 8-hydroxy-2-methylquinoline (10 mmol, 1.59 g) in anhydrous toluene (10 ml) was added to a solution of tri-i-butylaluminum (5 mmol, 5 ml 1.0M solution in anhydrous toluene) under argon. Vigorous gas evolution was observed and after 10 minutes anhydrous trimethylene borate (5 mmol, 1.22 g, 1.06 ml) was added to the mixture under argon. The reaction mixture was heated to a gentle reflux for 6 hours, during which time a yellow precipitate was formed. The product was collected by filtration after cooling the mixture to 0° C. A further sample was obtained on concentrating the filtrate to 25% volume, cooling to 0° C., and collecting the precipitate formed. The product was obtained as a yellow powder (2.00 g) which represented a 90% yield.

COMPOUND AND EXAMPLE 34

A solution of recrystallized 8-hydroxy-2-methylquinoline (5 mmol, 795 mg) in anhydrous toluene (10 ml) was added to a solution of tri-i-butylaluminum (5 mmol, 5 ml 1.0M solution in anhydrous toluene) under argon. Vigorous gas evolution was observed, and after 10 min. a solution of benzoic acid (10 mmol, 1.22 g) in anhydrous toluene (20 ml) was added to the mixture under argon. The reaction mixture was heated to a gentle reflux for 3 h, during which time a yellow precipitate was formed. Evaporation of the solvent afforded the product as a yellow powder (2.1 g) which represented a 99% yield.

COMPOUND AND EXAMPLE 35

A suspension of 4-phenylphenol (10 mmol, 1.7 g) in anhydrous toluene (50 ml) was heated to 80° C., and then transferred to a solution of tri-i-butylaluminum (5 mmol, 5 ml 1.0M solution in anhydrous toluene) under argon, using a cannula. Vigorous gas evolution was observed and the mixture was stirred for 30 min. after which time a solution of recrystallized 8-hydroxy-2-methylquinoline (5 mmol, 795 mg) in anhydrous toluene (10 ml) was added under argon. The reaction mixture was heated to a gentle reflux for 16 h, during which time a white precipitate was formed. The product was obtained by filtration as a white powder (1.94 g) which represented a 74% yield.

COMPOUND AND EXAMPLE 36

This compound was obtained analogously to compound 34 except that phenol was employed as delineated in Table IV.

COMPOUND AND EXAMPLE 37

A solution of recrystallized 8-hydroxy-2-methylquinoline (10 mmol, 1.59 g) in anhydrous toluene (10 ml) was added to a solution of tri-i-butylaluminum (5 mmol, 5 ml 1.0M solution in anhydrous toluene) under argon. Vigorous gas evolution was observed, and after 10 min. anhydrous 4,4'-biphenol (2.5 mmol, 465 mg) was added directly to the mixture under argon. The reaction mixture was heated to a gentle reflux for 3 h, during which time a cream precipitate was formed. The product was collected by filtration after cooling the mixture to 0° C., as a cream powder (2.01 g) which represented a 92% yield.

COMPOUND AND EXAMPLE 38

This compound was obtained analogously to compound 37 except that terephthalic acid was employed as delineated in Table V.

COMPOUND AND EXAMPLE 39

A solution of recrystallized 8-hydroxy-2-methylquinoline (10 mmol, 1.59 g) in anhydrous toluene (10 ml) was added to a solution of tri-i-butylaluminum (5 mmol, 5 ml 1.0M solution in anhydrous toluene) under argon. Vigorous gas evolution was observed and after 10 minutes anhydrous phenylboronic acid (2.5 mmol, 305 mg) was added to the mixture under argon. The reaction mixture was heated to a gentle reflux for 6 hours, during which time a cream precipitate was formed. The product was collected by filtration after cooling the mixture to 0° C. A further sample was obtained on concentrating the filtrate to 50% volume, cooling to 0° C., and collecting the precipitate formed. The product was obtained as a cream powder (1.82 g) which represented a 90% yield.

COMPOUND CHARACTERIZATIONS

The compounds prepared were analyzed and compared to theoretical compositions as shown in Table VI. This provided confirmation that the intended compounds had been synthesized.

TABLE VI

| Compound | Elemental Analysis | | | | | | | | |
|---|---|---|---|---|---|---|---|---|---|
| | Theoretical | | | Initial Powder (Observed) | | | Sublimed Powder (Observed) | | |
| | % N | % C | % H | % N | % C | % H | % N | % C | % H |
| 1 | 6.03 | 69.82 | 4.56 | 6.17 | 69.83 | 4.53 | 6.02 | 69.66 | 4.55 |
| 2 | 5.85 | 70.29 | 4.85 | 5.83 | 70.39 | 4.88 | | | |
| 3 | 5.67 | 68.01 | 4.69 | 5.94 | 63.66 | 4.49 | | | |
| 4 | 5.18 | 73.33 | 4.66 | 4.55 | 71.92 | 5.10 | | | |
| 5 | 5.18 | 73.33 | 4.66 | 5.14 | 73.33 | 4.88 | 5.67 | 72.93 | 4.81 |
| 6 | 8.28 | 68.63 | 5.16 | 7.66 | 65.99 | 5.30 | | | |
| 7 | 6.65 | 74.16 | 4.79 | 6.51 | 73.86 | 4.85 | | | |
| 8 | 8.58 | 68.71 | 4.12 | 8.10 | 67.26 | 4.33 | | | |
| 9 | 5.26 | 63.16 | 3.79 | 5.09 | 62.44 | 4.02 | | | |
| 10 | 5.44 | 72.37 | 4.51 | 4.64 | 74.45 | 5.26 | 5.51 | 71.34 | 4.57 |
| 11 | 5.28 | 70.18 | 4.37 | 5.48 | 71.11 | 4.87 | | | |
| 12 | 4.96 | 74.46 | 4.46 | 4.46 | 72.52 | 4.73 | | | |
| 13 | 9.03 | 67.09 | 4.33 | 9.10 | 63.36 | 4.09 | | | |
| 14 | 6.96 | 65.67 | 4.76 | 6.38 | 64.66 | 4.98 | 6.03 | 69.82 | 4.56 |
| 15 | 6.14 | 57.90 | 3.53 | 5.62 | 57.16 | 4.10 | 6.16 | 58.02 | 3.65 |
| 16 | 5.60 | 62.39 | 4.23 | 5.06 | 60.05 | 4.84 | 5.62 | 62.49 | 4.32 |
| 17 | 5.69 | 51.22 | 3.28 | 5.13 | 48.19 | 3.81 | 5.59 | 50.45 | 3.83 |
| 18 | 5.00 | 68.57 | 4.68 | 3.33 | 65.22 | 4.80 | 7.83 | 68.22 | 4.54 |
| 19 | 4.53 | 73.77 | 5.05 | 4.40 | 73.74 | 5.15 | 4.50 | 72.87 | 5.02 |
| 20 | 3.31 | 79.41 | 5.12 | 3.18 | 78.67 | 5.35 | | | |
| 21 | 6.73 | 69.22 | 6.05 | 6.22 | 69.72 | 6.18 | 6.86 | 70.90 | 6.34 |
| 22 | 6.22 | 71.99 | 5.15 | 5.96 | 68.49 | 5.15 | 6.10 | 58.71 | 4.23 |
| 23 | 9.31 | 69.17 | 4.91 | 8.58 | 68.69 | 5.15 | | | |
| 24 | 5.32 | 59.33 | 3.06 | 5.04 | 61.14 | 3.45 | 5.44 | 59.51 | 3.09 |
| 25 | 7.59 | 71.60 | 4.37 | 6.82 | 71.76 | 4.91 | | | |
| 26 | 7.38 | 69.58 | 4.25 | 6.71 | 68.98 | 4.78 | | | |
| 27 | 6.19 | 69.01 | 4.68 | 6.90 | 65.38 | 4.79 | 7.85 | 67.69 | 4.58 |
| 28 | 7.00 | 71.98 | 6.29 | 5.57 | 69.21 | 6.81 | 6.89 | 71.22 | 6.34 |
| 30 | 7.40 | 63.42 | 4.26 | 7.13 | 62.07 | 4.54 | 7.51 | 64.38 | 4.44 |
| 31 | 5.61 | 62.54 | 4.24 | 5.69 | 62.36 | 4.40 | | | |
| 32 | 5.11 | 56.98 | 3.86 | | | | | | |
| 34 | 3.28 | 67.45 | 4.25 | 3.06 | 65.61 | 4.63 | 6.01 | 69.79 | 4.64 |
| 35 | 2.68 | 78.00 | 5.01 | 2.61 | 79.62 | 5.43 | | | |
| 36 | 3.77 | 71.15 | 4.89 | 3.66 | 63.68 | 4.94 | 6.36 | 71.28 | 4.90 |
| 37 | 6.43 | 71.72 | 4.63 | 5.92 | 70.19 | 5.13 | | | |
| 38 | 6.59 | 67.76 | 4.26 | 4.66 | 59.67 | 4.81 | | | |

| Compounds with Boron | | | | | | | | |
|---|---|---|---|---|---|---|---|---|
| | Theoretical | | | | Initial Powder (Observed) | | | |
| | % N | % C | % H | % B | % N | % C | % H | % B |
| 33 | 6.31 | 62.19 | 4.99 | 2.43 | 5.28 | 58.39 | 5.35 | 2.20 |
| 39 | 6.95 | 68.50 | 4.62 | 1.34 | 5.45 | 63.02 | 5.06 | 1.40 |

The next task was to determine that the compounds were capable of undergoing vacuum evaporation while retaining their original structure. For compounds that are capable of undergoing vacuum evaporation without decomposition this procedure has the desirable effect of purifying the materials. In this technique a powder sample was placed in a porcelain boat which was then inserted into a 2.54 cm diameter Pyrex™ tube. Argon was flowed through the tube at a pressure of about 2 torr while the center of the tube was heated in a tube furnace. Each of the samples was treated in this way. The solids condensed from the vapor phase were analyzed, and the results are reported in Table VI.

ORGANIC EL DEVICE USE OF COMPOUNDS

EXAMPLES 40–49 ORGANIC EL DEVICES

A series of organic EL devices satisfying the requirements of the invention were constructed in the following manner:

(a) An indium tin oxide (ITO) coated glass substrate was ultrasonically cleaned in a commercial detergent, rinsed in deionized water, degreased in toluene vapor, and exposed to a strong oxidizing agent.

(b) A hole injecting layer of copper phthalocyanine (CuPc) having a thickness of 375 Å was deposited over the ITO on the substrate by vacuum evaporation from a tantalum boat.

(c) Onto the CuPc layer was deposited a 375 Å hole transporting layer of 4,4'-bis[N-(1-naphthyl)-N-phenylamino]biphenyl, also vacuum evaporated from a tantalum boat.

(d) An electron transporting layer of the invention (300 Å) was deposited onto the hole transporting layer. This compound was also vacuum evaporated from a tantalum boat.

(e) Over the electron transporting layer was deposited a 300 Å electron injecting layer of aluminum trisoxine, again by vacuum evaporation from a tantalum boat.

(f) A 2000 Å cathode of a 10:1 atomic ratio of Mg to Ag was formed by vacuum deposition onto the aluminum trisoxine layer to complete the organic EL device. The cell performance results are recorded and summarized below in Table VII.

TABLE VII

| Example | Compound | Emission Maximum (nm) | Electroluminescent Efficiency (W/A) |
|---|---|---|---|
| 40 | 1 | 498 | 0.016 |
| 41 | 2 | 497 | 0.014 |
| 42 | 5 | 510 | 0.019 |
| 43 | 6 | 504 | 0.029 |
| 44 | 10 | 504 | 0.017 |
| 45 | 15 | 514 | 0.009 |
| 46 | 16 | 503 | 0.010 |
| 47 | 19 | 480 | 0.022 |
| 48 | 20 | 478 | 0.024 |
| 49 | 30 | 515 | 0.012 |

The operation of the organic EL devices in terms of efficiency (measured in watts of emission per ampere of current), initial light output (initial intensity in milliwatts per $cm^2$) and stability (measured as the number of hours required for initial light output to decline to one half its original intensity when driven at a constant current of 20 $mA/cm^2$) are summarized in Table VIII.

TABLE VIII

| Example | Compound | Initial Light output (mW/cm²) | ½ ILO (hrs) |
|---|---|---|---|
| 40 | 1 | 0.32 | 170 |
| 41 | 2 | 0.28 | 125 |
| 42 | 5 | 0.38 | 300 |
| 44 | 10 | 0.34 | 325 |
| 47 | 19 | 0.44 | 25 |
| 48 | 20 | 0.48 | 50 |
| 49 | 30 | 0.24 | 70 |

Each of the organic EL devices with LH selected from benzoic acid and its derivatives were considered acceptable in terms of both initial efficiency and light output. Being able to maintain at least half of initial light output after 50 hours was taken as a measure of minimum acceptable stability. Metal chelates of the same class wherein LH is either triphenylsilanol or tris(4,4'-biphenyl)silanol resulted in compounds which were blue-green emitting with still higher efficiency levels.

Taking both performance and chromaticity into account it can be seen that best overall performance was achieved with methyl or phenyl substituted benzoic acid ligands. Methyl substituents are considered representative of lower alkyl (1, 2 or 3 carbons atom) substituents while the phenyl substituents are considered representative of phenyl, biphenyl and naphthyl substituent group performance.

EXAMPLES 50–54 ELECTROLUMINESCENT DEVICES WITH BLUE FLUOROSCENT DOPANTS INCORPORATED IN THE EMITTING LAYER

A series of organic EL devices were constructed as in Example 40, except that the layer described in Example 40 was doped with varied amounts of perylene, ranging from 0.5 to 3 mole percent, based on Example 40. The results are summarized below in Table IX.

TABLE IX

| Example | Compound | Vol % Dopant | Emission Maxima* (nm) | Electroluminescent Efficiency (W/A) |
|---|---|---|---|---|
| 50 | 1 | 0.5 | 482, 450 | 0.019 |
| 51 | 1 | 1 | 482, 450 | 0.017 |
| 52 | 19 | 0.5 | 450, 482 | 0.023 |
| 53 | 19 | 1 | 450, 482 | 0.025 |
| 54 | 19 | 2 | 450, 482 | 0.017 |

*The perylene emission spectrum is comprised of two main peaks. The dominant peak is given first.

From Table IX it is apparent that all concentrations of perylene, ranging from 0.5 to 3 mole per cent, based on Example 40, were effective in shifting the emission hues of the organic EL devices of Examples 50 to 54 to shorter wavelengths. Figure XIII illustrates the hue shift towards blue that is provided by perylene. The concentration range of 0.2 to 3 mole percent is a preferred range, with 0.5 to 2 mole percent being an optimum range.

The invention has been described in detail with particular reference to preferred embodiments thereof, but it will be understood that variations and modifications can be effected within the spirit and scope of the invention.

What is claimed is:

1. An aluminum chelate of the formula:

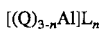

wherein n is 1 or 2; and,

Q is a substituted 8-quinolinolato group in which the 2-position substituent is selected from the group consisting of hydrocarbon groups containing from 1 to 10 carbon atoms, amino, aryloxy and alkoxy groups;

L satisfies one of the following formula:

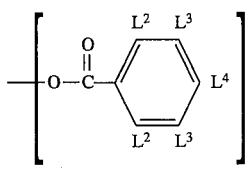

or

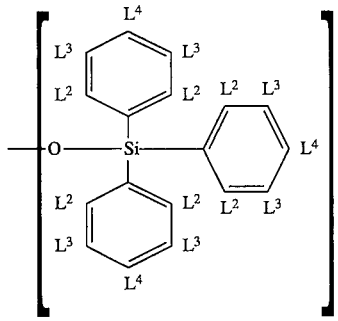

wherein $L^2$ to $L^4$ are substituents which collectively contain up to 18 carbon atoms, said substituents being individually selected for each L ligand from the group consisting of hydrogen, hydrocarbon groups containing from 1 to 12 carbon atoms, cyano, amino and halogen substituents.

* * * * *